United States Patent
Wells

(10) Patent No.: US 8,102,008 B2
(45) Date of Patent: Jan. 24, 2012

(54) INTEGRATED CIRCUIT WITH BURIED DIGIT LINE

(75) Inventor: David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 12/836,404

(22) Filed: Jul. 14, 2010

(65) Prior Publication Data

US 2010/0276741 A1    Nov. 4, 2010

Related U.S. Application Data

(60) Continuation of application No. 11/933,051, filed on Oct. 31, 2007, now Pat. No. 7,768,073, which is a division of application No. 11/491,461, filed on Jul. 21, 2006, now Pat. No. 7,368,365, which is a division of application No. 11/036,163, filed on Jan. 14, 2005, now Pat. No. 7,229,895.

(51) Int. Cl.
*H01L 27/088* (2006.01)

(52) U.S. Cl. ........ 257/374; 257/296; 257/308; 257/397; 257/510; 257/532

(58) Field of Classification Search ............... 257/293, 257/306, 308, 374, 397, 510, 516, 532, E21.545, 257/E21.546, E27.044, E27.048, E27.071, 257/E27.088
See application file for complete search history.

(56) References Cited

U.S. PATENT DOCUMENTS

| | | |
|---|---|---|
| 3,941,629 A | 3/1976 | Jaffe |
| 4,139,442 A | 2/1979 | Bondur et al. |
| 4,333,964 A | 6/1982 | Ghezzo |
| 4,472,459 A | 9/1984 | Fisher |
| 4,508,757 A | 4/1985 | Fabricius et al. |
| 4,551,910 A | 11/1985 | Patterson |
| 4,615,762 A | 10/1986 | Jastrzebski et al. |
| 4,630,356 A | 12/1986 | Christie et al. |

(Continued)

FOREIGN PATENT DOCUMENTS

JP    53-148389    12/1978

(Continued)

OTHER PUBLICATIONS

"Notes from IEDM, part 3," http://www.thinfilmmfg.com/Noteworthy/Noteworthy01/IEDM12Dec01.htm, 2 pages (Dec. 12, 2001).

(Continued)

*Primary Examiner* — N Drew Richards
*Assistant Examiner* — Joannie A Garcia
(74) *Attorney, Agent, or Firm* — Knobbe, Martens, Olson & Bear, LLP

(57) ABSTRACT

A method of forming a buried digit line is disclosed. Sacrificial spacers are formed along the sidewalls of an isolation trench, which is then filled with a sacrificial material. One spacer is masked while the other spacer is removed and an etch step into the substrate beneath the removed spacer forms an isolation window. Insulating liners are then formed along the sidewalls of the emptied trench, including into the isolation window. A digit line recess is then formed through the bottom of the trench between the insulating liners, which double as masks to self-align this etch. The digit line recess is then filled with metal and recessed back, with an optional prior insulating element deposited and recessed back in the bottom of the recess.

20 Claims, 6 Drawing Sheets

U.S. PATENT DOCUMENTS

| | | |
|---|---|---|
| 4,746,630 A | 5/1988 | Hui et al. |
| 4,789,560 A | 12/1988 | Yen |
| 4,882,291 A | 11/1989 | Jeuch |
| 4,897,700 A | 1/1990 | Nakamura |
| 4,903,344 A | 2/1990 | Inoue |
| 4,959,325 A | 9/1990 | Lee et al. |
| 4,965,221 A | 10/1990 | Dennison et al. |
| 5,041,898 A | 8/1991 | Urabe et al. |
| 5,057,449 A | 10/1991 | Lowrey et al. |
| 5,087,586 A | 2/1992 | Chan et al. |
| 5,128,274 A | 7/1992 | Yabu et al. |
| 5,149,669 A | 9/1992 | Hosaka |
| 5,210,046 A | 5/1993 | Crotti |
| 5,252,504 A | 10/1993 | Lowrey et al. |
| 5,260,229 A | 11/1993 | Hodges et al. |
| 5,316,966 A | 5/1994 | Van Der Plas et al. |
| 5,358,894 A | 10/1994 | Fazan et al. |
| 5,409,563 A | 4/1995 | Cathey |
| 5,438,016 A | 8/1995 | Figura et al. |
| 5,457,067 A | 10/1995 | Han |
| 5,458,999 A | 10/1995 | Szabo et al. |
| 5,466,632 A | 11/1995 | Lur et al. |
| 5,468,675 A | 11/1995 | Kaigawa |
| 5,607,874 A | 3/1997 | Wang et al. |
| 5,747,377 A | 5/1998 | Wu |
| 5,789,306 A | 8/1998 | Roberts et al. |
| 5,834,359 A | 11/1998 | Jeng et al. |
| 5,899,727 A | 5/1999 | Hause et al. |
| 5,909,630 A | 6/1999 | Roberts et al. |
| 6,008,106 A | 12/1999 | Tu et al. |
| 6,097,065 A | 8/2000 | Forbes et al. |
| 6,104,068 A | 8/2000 | Forbes |
| 6,150,687 A | 11/2000 | Noble et al. |
| 6,172,391 B1 | 1/2001 | Goebel et al. |
| 6,306,727 B1 | 10/2001 | Akram |
| 6,320,222 B1 | 11/2001 | Forbes et al. |
| 6,350,635 B1 | 2/2002 | Noble et al. |
| 6,355,961 B1 | 3/2002 | Forbes |
| 6,376,317 B1 | 4/2002 | Forbes et al. |
| 6,377,070 B1 | 4/2002 | Forbes |
| 6,399,979 B1 | 6/2002 | Noble et al. |
| 6,413,825 B1 | 7/2002 | Forbes |
| 6,414,356 B1 | 7/2002 | Forbes et al. |
| 6,424,001 B1 | 7/2002 | Forbes et al. |
| 6,448,601 B1 | 9/2002 | Forbes et al. |
| 6,492,233 B2 | 12/2002 | Forbes et al. |
| 6,496,034 B2 | 12/2002 | Forbes et al. |
| 6,504,201 B1 | 1/2003 | Noble et al. |
| 6,531,727 B2 | 3/2003 | Forbes et al. |
| 6,537,870 B1 | 3/2003 | Shen |
| 6,559,491 B2 | 5/2003 | Forbes et al. |
| 6,566,682 B2 | 5/2003 | Forbes |
| 6,639,268 B2 | 10/2003 | Forbes et al. |
| 6,664,806 B2 | 12/2003 | Forbes et al. |
| 6,670,642 B2 | 12/2003 | Takaura et al. |
| 6,734,482 B1 | 5/2004 | Tran et al. |
| 6,734,484 B2 | 5/2004 | Wu |
| 6,756,625 B2 | 6/2004 | Brown |
| 6,777,725 B2 | 8/2004 | Willer et al. |
| 6,797,573 B2 | 9/2004 | Brown |
| 6,798,009 B2 | 9/2004 | Forbes et al. |
| 6,801,056 B2 | 10/2004 | Forbes |
| 6,806,137 B2 | 10/2004 | Tran et al. |
| 6,808,979 B1 | 10/2004 | Lin et al. |
| 6,964,895 B2 | 11/2005 | Hsu |
| 7,009,233 B2 | 3/2006 | Uchiyama et al. |
| 7,229,895 B2 | 6/2007 | Wells |
| 7,368,365 B2 | 5/2008 | Wells |
| 7,601,608 B2 | 10/2009 | Wells |
| 7,768,073 B2 | 8/2010 | Wells |
| 2002/0030214 A1 | 3/2002 | Horiguchi |
| 2003/0001290 A1 | 1/2003 | Nitayama et al. |
| 2003/0205748 A1 | 11/2003 | Park |
| 2003/0227072 A1 | 12/2003 | Forbes et al. |
| 2004/0150028 A1* | 8/2004 | Horiguchi ............ 257/306 |
| 2004/0191985 A1 | 9/2004 | Tu |
| 2005/0067646 A1 | 3/2005 | Chen et al. |
| 2005/0079721 A1 | 4/2005 | Buerger et al. |
| 2005/0145913 A1 | 7/2005 | Katsumata et al. |

FOREIGN PATENT DOCUMENTS

| | | |
|---|---|---|
| JP | 60-167349 | 8/1985 |
| JP | 1-100948 | 4/1989 |
| JP | 2-219253 | 8/1990 |
| JP | 4-130630 | 5/1992 |
| JP | 4-162528 | 6/1992 |

OTHER PUBLICATIONS

"Quantum confinement effects in a 3D FinFET transistor," http://www.ise.com/appex/FinFET/FinFET.html, 5 pages (Jan. 15, 2003).

Clarke, Peter, "ISSCC: Vertical transistor structures considered," *EE Times Website*, http://www.eetimes.com, 3 pages (Feb. 9, 2000).

Goebel et al., "Fully depleted surrounding gate transistor (SGT) for 70 nm DRAM and beyond," *IEEE*, 5 pages (2002).

Mandelman et al., "Challenges and future directions for the scaling of dynamic random-access memory (DRAM)," *IBM J. Res. & Dev.*, vol. 46, No. 2/3, pp. 187-212 (Mar./May 2002).

Lau et al., "High aspect ratio submicron silicon pillars fabricated by photoassisted electrochemical etching and oxidation," *Applied Physics Letters*, vol. 67(13), pp. 1877-1879 (Sep. 25, 1995).

Lau et al. "High aspect ratio sub-micron silicon pillars for light emission studies and photonic band gap material application," 1995/6 Research Journal, Microelectronics Group, 3 pages (Jun. 1996).

Lutze et al., "Field oxide thinning in poly buffer LOCOS isolation with jActive area spacings to 0.1 um,"*Journal of Electrochemical Society*, vol. 137, No. 6,pp. 1867-1870 (Jun. 1990).

Seeger et al., "Fabrication of ordered arrays of silicon nanopillars," *J. Phys. D: Appl. Phys.*, vol. 32, pp. L129-L132 (1999).

P. Xuan et al., "60nm planarized ultra-thin body solid phase epitaxy MOSFETs," IEEE Device Research Conf., Denver, CO, pp. 67-68, Jun. 2000.

Wolf et al., "Silicon processing for the VLSI era,"vol. 1, Lattice Press, CA, USA, pp. 529-555 (1986).

P.Kalavade et al., "A novel sub-10nm transistor," IEEE Device Research Conf., Denver, CO pp. 71-72, Jun. 2000.

J.P. Denton et al., "Fully depleted dual-gate thin-film SOI p-MOSFET's fabricated in SOI islands with an isolated buried polysilicon backgate," *IEEE Electron Device Lett.*, vol. 17, No. 11, pp. 509-511, Nov. 1996.

Xuejue Huang, et al., "Sub-50 nm P-Channel FinFET," *IEEE Transactions on Electron Devices*, vol. 48, No. 5, May 2001.

J. Kedzierski, et al., "High-performance symmetric-gate and CMOS-compatible Vt asymmetric-gate FinFET devices" *IEDM*, 2001, paper 19.5.

K. Kim, et al., "Nanoscale CMOS Circuit Leakage Power Reduction by Double-Gate Device" International Symposium on Low Power Electronics and Design Newport Beach Marriott Hotel, Newport, California, Aug. 9-11, 2004, http://www.islped.org.

B.S. Doyle, et al., "High performance fully-depleted tri-gate CMOS transistors," *IEEE Electron Device Letters*, vol. 24, No. 4, Apr. 2003, pp. 263-265.

B. Doyle, et al., "Tri-Gate fully-depleted CMOS transistors: fabrication, design and layout," 2003 *Symposium on VLSI Technology*. Digest of Technical Papers, Tokyo; Japan Soc. Applied Phys, 2003, pp. 133-134.

H. Takato, et al. "High performance CMOS surrounding gate transistor (SGT) for ultra high density LSIs," *IEEE Electron Devices Meeting*, Technical Digest, pp. 222-225, 1998.

S. Miyano, et al., "Numerical analysis of a cylindrical thin-pillar transistor (CYNTHIA)," *IEEE Transactions on Electron Devices*, vol. 39, No. 8, Aug. 1992, pp. 1876-1881.

H-S P. Wong et al., "Self-aligned (top and Bottom) Double-Gate MOSFET with a 25nm Thick Silicon Channel," *IEEE Int. Electron Device Meeting*, 1997, pp. 427-430.

Hyun-Jin Cho, et al., "A novel pillar DRAM cell 4 Gbit and beyond," *Digest of Technical Papers Symposium on VLSI Technology*, Jun. 9-11, 1998, pp. 38-39.

W. Sakamoto, et al., "A study of current drivability of SGT," *Record of Electrical and Communication Engineering* Conversazione Tohoku University, vol. 72, No. 2, Feb. 2004, pp. 110-111.

R. Nishi, et al., "Concave Source SGT for suppressing punch-through effect," *Transactions of the Institute of Electronics, Information and Communication Engineers* C, vol. J86-C, No. 2, Feb. 2003, pp. 200-201.

W. Zhang, et al., :A study of load capacitance in SGT, *Record of Electrical and Communication Engineering* Conversazione Tohoku University, vol. 71, No. 1, Oct. 2002, pp. 473-474.

H. Yamashita, et al., "A study of process design in three dimensional SGT device," *Record of Electrical and Communication Engineering* Conversazione Tohoku University, vol. 71, No. 1, Oct. 2002, pp. 467-468.

C.K. Date, et al., "Suppression of the floating-body effect using SiGe layers in vertical surrounding-gate MOSFETs," *IEEE Transactions on Electron Devices*, vol. 48, No. 12, Dec. 2001, pp. 2684-2689.

R. Nishi, et al., "Analysis of the shape of diffusion layer of SGT for suppressing substrate bias effect," *Transactions of the Institute of Electronics, Information and Communication Engineers* C, vol. J84-C, No. 10, Oct. 2001, pp. 1018-1020.

I. De, et al., "Impact of gate workfunction on device performance at the 50 nm technology node," *Solid-State Electronics*, vol. 44, No. 6, Jun. 2000, pp. 1077-1080.

Hyun-Jin Cho, et al., "High performance fully and partially depleted poly-Si surrounding gate transistors," In: 1999 *Symposium on VLSI Technology*. Digest of Technical Papers (IEEE Cat. No. 99CH 36325). Tokyo, Japan: Japan Soc. Appl. Phys, 1999, pp. 31-32.

T. Nakamura, "A study of steady-state characteristics of SGT type three-dimensional MOS transistor," *Record of Electrical and Communication Engineering Conversazione Tohoku University*, vol. 66, No. 1, Jan. 1998, pp. 211-212.

T. Endoh, et al., "Analysis of high speed operation for multi-SGT," *Transactions of the Institute of Electronics, Information and Communication Engineers* C-I, vol. J80C-I, No. 8, Aug. 1997, pp. 382-383.

T. Endoh, et al., "An accurate model of fully-depleted surrounding gate transistor (FD-SGT)," *IEICE Transactions on Electronics*, vol. E80-C, No. 7, Jul. 1997, pp. 905-910.

T. Endoh, et al., "An analytic steady-state current-voltage characteristic of short channel fully-depleted surrounding gate transistor (FD-SGT)," *IEICE Transactions on Electronics*, vol. E80-C, No. 7, Jul. 1997, pp. 911-917.

K. Abhinav, et al, "An analytical temperature dependent threshold voltage model for thin film surrounded gate SOL MOSFET," *Proceedings of the SPIE—The International Society for Optical Engineering*, vol. 3975, pt. 1-2, 2000, pp. 605-608.

S. Miyamoto, et al., "Effect of LDD structure and channel poly-Si thinning on a gate-all-around TFT (GAT) for SRAM's," *IEEE Transactions on Electron Devices*, vol. 46, No. 8, Aug. 1999, pp. 1693-1698.

M. Terauchi, et al., "Depletion isolation effect of surrounding gate transistors," *IEEE Transactions on*, vol. 44, Issue 12, Dec. 1997, pp. 2303-2305.

A. Kranti, et al., "Optimisation for improved short-channel performance of surrounding/cylindrical gate MOSFETs," *Electronics Letter*, vol. 37, Issue 8, Apr. 12, 2001, pp. 533-534.

F. Matsuoka, et al., "A study of soft error in SGT DRAM," *Record of Electrical and Communication Engineering* Conversazione Tohoku University, vol. 71, No. 1, Oct. 2002, pp. 469-470, Journal Paper.

M. Suzuki, et al., "The 2.4F/sup 2/ memory cell technology with Stacked-Surrounding Gate Transistor (S-SGT) DRAM," *Transactions of the Institute of Electronics*, Information and Communication Engineers C, vol. J83-C, No. 1, Jan. 2000, pp. 92-93.

T. Endoh, et al., "The analysis of the stacked-surrounding gate transistor (S-SGT) DRAM for the high spped and low voltage operation," *IEICE Transactions on Electronics*, vol. E81-C, No. 9, Sep. 1998, pp. 1491-1498.

T. Endoh, et al., "The Stacked-SGT DRAM using 3D-building memory array technology," *Transactions of the Institute of Electronics, Information and Communication Engineers* C-I, vol. J81C-I, No. 5, May 1998, pp. 288-289.

S. Watanabe, et al., "A novel circuit technology with surrounding gate transistors (SGT's) for ultra high density DRAM's," *IEEE Journal of Solid-State Circuits*, vol. 30, No. 9, Sep. 1995, pp. 960-971.

M. Terauchi, et al., "A surrounding gate transistor (SGT) gain cell for ultra high density DRAMs," In: *1993 Symposium on VLSI Technology*. Digest of Technical Papers (IEEE Cat. No. 93CH 3303-5). Tokyo, Japan: Bus. Center for Acad. Soc. Japan, 1993, pp. 21-22.

K. Sunouchi, et al., "A surrounding gate transistor (SGT) cell for 64/256 Mbit DRAMs," In: *International Electron Devices Meeting 1989*. Technical Digest (Cat. No. 89CH2637-7). New York, NY, USA: IEEE, 1989, pp. 23-26.

S.J. Ahn, et al., "Examination and improvement of reading disturb characteristics of a surrounded gate STTM memory cell," In: *2003 Third IEEE Conference on Nanotechnology*. IEEE-NANO 2003. Proceedings (Cat. No. 03TH8700). Piscataway, NJ, USA: IEEE, 2003, pp. 528-530, vol. 2.

S.J. Ahn, et al., "Highly scalable and CMOS-compatible STTM cell technology," In: *IEEE International Electron Devices Meeting 2003*, Piscataway, NJ, USA: IEEE, 2003, pp. 10.4.1-10.4.4.

F. Matsuoka, et al., "Numerical analysis of alpha-particle-induced soft errors in floating channel type surrounding gate transistor (FC-SGT) DRAM cell," *Electron Devices*, IEEE Transactions on, vol. 50, Issue 7, Jul. 2003, pp. 1638-1644.

T. Endoh, et al., "The 1.44F2 memory cell technology with the stacked-surrounding gate transistor (S-SGT) DRAM," *Microelectronics, Proceedings, 2000 22nd International Conference* on, vol. 2, May 14-17, 2000, pp. 451-454, vol. 2.

M. Iwai, et al., "Buried gate type SGT flash memory," *Transactions of the Institute of Electronics, Information and Communication Engineers* C, vol. J86-C, No. 5, May 2003, pp. 562-564. Journal Paper.

T. Endoh, et al., "Novel ultra high density flash memory with a stacked-surrounding gate transistor (S-SGT) structured cell," In: International Electron Devices Meeting. *Technical Digest*, IEEE, 2001, pp. 2.3.1-2.3.4.

T. Endoh, et al., "Floating channel type SGT flash memory," *Transactions of the Institute of Electronics, Information and Communication Engineers* C-I, vol. J82C-I, No. 3, Mar. 1999, pp. 134-135.

M. Hioki, et al., "An analysis of program and erase operation for FC-SGT flash memory cells," *Simulation of Semiconductor Processes and Devices*. SISPAD 2000. 2000 International Conference on, Sep. 6-8, 2000. pp. 116-118.

T. Sakai, et al., "A study of stacked-SGT-based pass transistor logic circuit," *Record of Electrical and Communication Engineering* Conversazione Tohlku University, vol. 72, No. 2, Feb. 2004, pp. 108-109.

S. Watanabe, "Impact of three-dimensional transistor on the pattern area reduction for ULSI," *IEEE Transaction on Electron Devices*, vol. 50, No. 10, Oct. 2003, pp. 2073-2080.

A. Nitayama, et al., "High speed and compact CMOS circuits with multi-pillar surrounding gate transistors," *IEEE Transactions on Electron Devices*, vol. 36, No. 11, pt. 1, Nov. 1989, pp. 2605-2606.

T. Endoh, et al., "A high signal swing pass-transistor logic using surrounding gate transistor," *Simulation of Semiconductor Processes and Devices*. SISPAD 2000. 2000 International Conference on, Sep. 6-8, 2000, pp. 273-275.

A. Nitayama, "Multi-pillar surrounding gate transistor (M-SGT) for compact and high-speed circuits," Electron Devices, *IEEE Transactions on*, vol. 38, Issue 3, Mar. 1991, pp. 579-583.

H. Takato, et al., "Impact of surrounding gate transistor (SGT) for ultra-high density LSI's," Electron Devices, *IEEE Transactions on*, vol. 38, Issue 3, Mar. 1991, pp. 573-578.

\* cited by examiner

INTEGRATED CIRCUIT WITH BURIED DIGIT LINE

PRIORITY APPLICATIONS AND RELATED APPLICATION

This application is a continuation of U.S. patent application Ser. No. 11/933,051 (filed 31 Oct. 2007), which is a divisional of U.S. patent application Ser. No. 11/491,461 (filed 21 Jul. 2006), issued as U.S. Pat. No. 7,368,365, which is a divisional of U.S. patent application Ser. No. 11/036,163 (filed 14 Jan. 2005), issued as U.S. Pat. No. 7,229,895. The entire disclosure of each of these priority applications is hereby incorporated by reference herein.

This application is also related to U.S. patent application Ser. No. 11/490,619 (filed 21 Jul. 2006), issued as U.S. Pat. No. 7,601,608, which is which is a divisional of U.S. patent application Ser. No. 11/036,163 (filed 14 Jan. 2005), issued as U.S. Pat. No. 7,229,895.

FIELD OF THE INVENTION

The present invention relates to the field of integrated circuit fabrication, specifically to the formation of memory arrays.

DESCRIPTION OF THE RELATED ART

Since the introduction of the digital computer, electronic storage devices have been a vital resource for the retention of data. Conventional semiconductor electronic storage devices, such as Dynamic Random Access Memory (DRAM), typically incorporate capacitor and transistor structures in which the capacitors temporarily store data based on the charged state of the capacitor structure. In general, this type of semiconductor Random Access Memory (RAM) often requires densely packed capacitor structures that are easily accessible for electrical interconnection.

The capacitor and transistor structures are generally known as memory cells. The memory cells are arranged into memory arrays. The memory cells are addressed via a word line and a digit line, one of which addresses a "column" of memory cells while the other addresses a "row" of memory cells.

In many DRAM devices, the digit line is buried below the upper level of the substrate. One example of this is burying the digit line within the isolation trench. However, this can often involve several complicated steps. Furthermore, as integrated circuit designs become more dense, it becomes more difficult to isolate a buried digit line within its trench and to make contact with individual transistors in the array.

Thus, simpler and more reliable methods for forming, isolating and contacting buried digit lines are desired.

SUMMARY OF THE INVENTION

In accordance with one aspect of the invention, a method is provided for forming an integrated circuit. The method includes forming an elongated trench between a first transistor active region and a second transistor active region. An isolation element is deposited asymmetrically within the trench in contact with the second transistor active region. A bit line structure is deposited within the trench in direct contact with the active region and the isolation element, wherein the isolation element is positioned between the bit line structure and the second transistor active region.

In accordance with another aspect of the invention, a method is provided for forming a buried digit line. The method includes forming a trench in a substrate with a base and side walls. A first spacer is formed along a first trench side wall and a second spacer along a second trench side wall. The trench is filled with a first sacrificial material after forming the first spacer and the second spacer. The second spacer is removed to expose a portion of a base of the trench after filling the trench with the first sacrificial material. The exposed first portion of the base of the trench is etched to form an isolation window having a first depth. A first insulating liner is deposited along the first trench wall and the second insulating liner is deposited along the second trench side wall into the isolation window. A recess is formed in the substrate by etching a second exposed portion of the base of the trench between the first liner and the second liner to a second depth. A digit line is then formed in the recess.

In accordance with another aspect of the invention, a method of forming a memory array is provided. The method includes forming an elongated trench having first and second sides in a substrate. An asymmetric isolation window is formed in the trench using sacrificial spacers, where the asymmetric isolation window is formed along the second side of the trench. Insulating spacers are deposited along the sides of the trench and fill the insulation window. A digit line recess is formed between the insulating spacers in the substrate beneath the trench. A digit line is formed in the digit line recess. The digit line electrically connects to a first memory cell on the first side and is electrically isolated by the asymmetric isolation window from a second memory cell on the second side.

In accordance with another aspect of the invention, a computer memory structure is provided. The structure includes a plurality of active regions in a substrate, where the active regions are arranged in a plurality of columns. A trench in the substrate separates a first column from a second column. A digit line in the trench directly contacts the first column. A filled asymmetric isolation window within the trench separates the digit line from the second column.

In accordance with another aspect of the invention, an integrated circuit is provided, including a first elongated semiconductor ridge and a second elongated semiconductor ridge parallel to and spaced from the first ridge. The first and second ridges separated by a trench. Each of the first and second ridges serve as active areas for a plurality of transistors along the lengths of the ridges. The trench includes a conductive line in continuous electrical contact with the first ridge. An insulating element within the trench separates the conductive line from the second ridge.

BRIEF DESCRIPTION OF THE DRAWINGS

These and other aspects of the invention will be better understood from the detailed description below and the appended drawings, which are meant to illustrate and not to limit the invention, and in which.

DETAILED DESCRIPTION OF THE PREFERRED EMBODIMENTS

In a preferred embodiment, a buried digit line is formed in a trench between rows of transistors. After forming trenches, spacers are formed within each trench. A sacrificial material is deposited within the trenches. One of the spacers is then removed from the trench, and the substrate below the removed spacer is etched to form an isolation window. After the isolation window is formed, the spacers and sacrificial material are removed. An insulating liner is formed conformally over the memory array. A spacer etch is then performed to preferentially etch horizontal surfaces. This exposes a portion of the trench. The exposed bottom of the trench is preferably etched at this stage to provide a recess in the substrate. If the insulating liner reaches the bottom of this recess, then the digit line can be deposited directly into the recess. Otherwise, an insulating layer is preferably deposited into the trench before forming the digit line. An insulator is formed within the trench, and then etched back. Transistors and capacitors are completed at positions between and above the trenches to form the memory cell.

Figure 1:
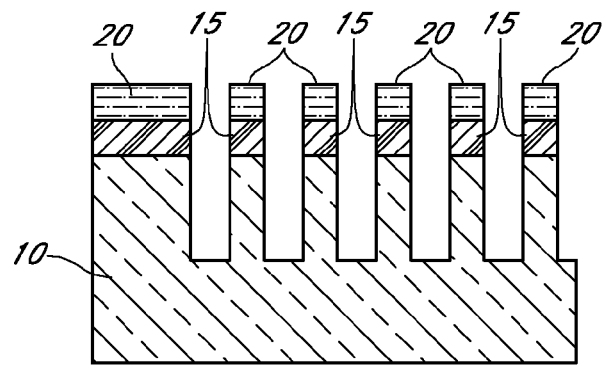
FIG. 1 is a schematic, cross-sectional side view of a substrate with trenches with a thin "pad oxide" grown over the surface of the substrate, a thicker layer of silicon nitride ($Si_3N_4$), and a photoresist mask in accordance with a starting point for preferred embodiments of the present invention.

Referring now to an embodiment illustrated in FIG. 1, a semiconductor substrate 10, such as bulk silicon, like a silicon wafer, is provided. A cap layer 15 may be formed over the substrate 10 in order to protect the substrate 10 from damage that could be caused during processing. The cap layer is preferably silicon nitride, but other insulating materials can also be used. Preferably, the trenches are then masked using photoresist 20 although other masking techniques can also be used.

In a first step, trenches are formed in the substrate 10. The trench can be formed in a variety of methods. Preferably, an anisotropic dry etch process, such as a reactive ion etch process, is used to etch the trenches. In a preferred embodiment the trench has a depth of between about 1500 Å and 6000 Å, more preferably between about 2000 Å and 3000 Å. The width of the trenches is preferably between about 100 Å and 2000 Å, more preferably between about 350 Å (using a 0.04 µm process) and 1000 Å (using a 0.100 µm process). An oxidation of the walls and base of the trench followed by an oxide etch step may also be performed in order to smooth trench walls. Skilled practitioners will appreciate that trenches can be formed in a variety of ways.

Figure 2:
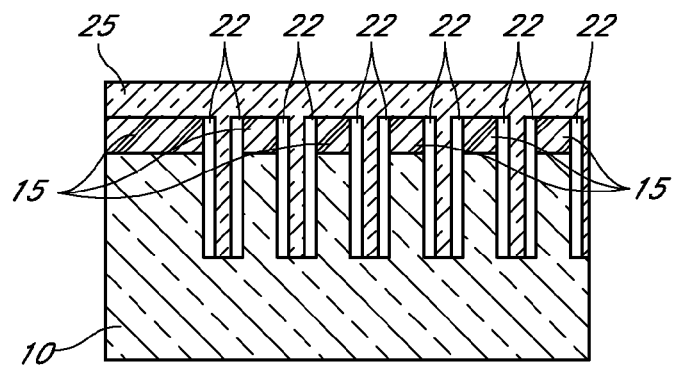
FIG. 2 is a schematic, cross-sectional side view of the substrate of FIG. 1 after spacers have been formed and the trench has been filled with a sacrificial material.

As seen in FIG. 2, after the trench is formed, a first set of spacers 22 is formed on the walls of the trench. Preferably, a conformal liner of spacer material is deposited over the array. The spacer material is preferably silicon dioxide, but can also be other materials which can be selectively etched relative to the surrounding materials. A spacer etch, which preferentially removes horizontal layers relative to vertical layers, is then performed to expose a portion of the base of the trench and leaving the spacers 22 along the sidewalls of the trench. The spacers 22 preferably have a thickness of between about 50 Å and 600 Å, more preferably between about 100 Å and 300 Å, representing about ⅓ of the trench width.

After forming the spacers 22, a sacrificial material 25 is deposited over the array, filling the trenches. In a preferred embodiment, the sacrificial material 25 is polysilicon, but the sacrificial material can be any material that can be selectively etched to the material of the spacer 22.

Figure 3:
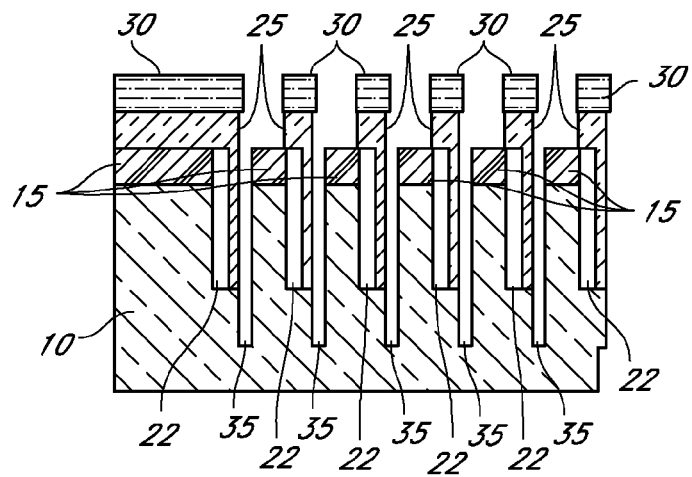
FIG. 3 is a schematic, cross-sectional side view of the substrate of FIG. 2 after one of the spacers has been removed and an etch into the substrate has been performed.

Referring now to FIG. 3, one of the spacers 22 along the sidewalls of the trench is removed. In a preferred embodiment, a photoresist mask 30 is used during an etch of the sacrificial material 25 and one of the spacers 22. However, skilled practitioners will appreciate other masking techniques can be used. The exposed sacrificial material 25 is etched through the mask before the spacer 22 is removed. This etch process can be performed in distinct steps or in one etch step.

After one spacer 22 is removed, a portion of the trench floor is left exposed. An etch process which will etch the substrate 10 selectively to the sacrificial material 25 is then performed to form an isolation window or slot 35. Preferably, the isolation window 35 is asymmetric in that it will contact one side of the digit line, but not the other. In a preferred embodiment, the isolation window extends between about 500 Å and 3000 Å below the trench floor, more preferably between about 1000 Å and 2000 Å.

Figure 4:
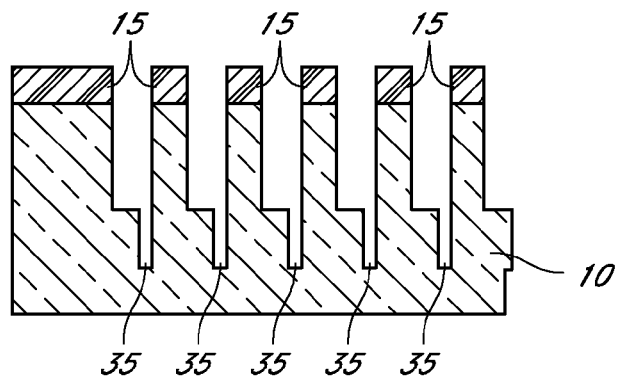
FIG. 4 is a schematic, cross-sectional side view of the substrate of FIG. 3 with the remaining spacer and sacrificial material removed.

As seen in FIG. 4, the mask and remaining sacrificial material and spacer material are preferably removed after forming the isolation window 35.

Figure 5:
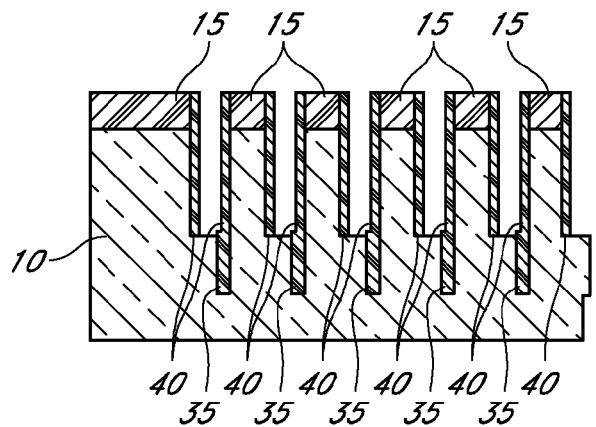
FIG. 5 is a schematic, cross-sectional side view of the substrate of FIG. 4 after depositing insulating liners.

In FIG. 5, a second set of spacers is formed. First, an insulating layer 40 is conformally deposited over the array and the cap layer 15. The insulating layer 40 is preferably silicon nitride, but other electrically insulating materials can also be used. The insulating layer preferably fills the isolation window 35 with a lower insulating layer. Preferably the insulating layer 40 has a thickness along the sidewalls of between about 60 Å and 600 Å, more preferably between about 100 Å and 200 Å.

After the conformal insulating layer is deposited, another spacer etch is performed to preferentially etch the horizontal surfaces of the insulating layer 40 and expose a second portion of the trench floor. This etch leaves remaining portions of the insulating layer 40 on the trench side walls in the form of insulating spacers that extend into the isolation window 35.

Figure 6:
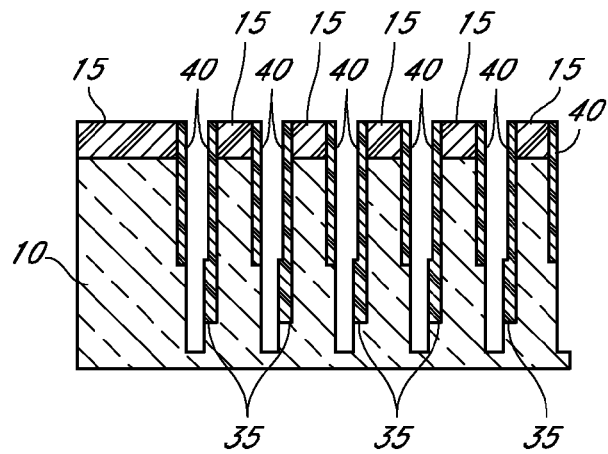
FIG. 6 is a schematic, cross-sectional side view of the substrate of FIG. 5 after etching the substrate using the liners as a mask.

An etch process selectively etches the substrate material relative to the materials selected for the cap layer 15 and the insulating layer 40 to recess the exposed portion of the trench floor to form a lower recess 45 in the substrate 10. In a preferred embodiment, this etch process etches between about 10 Å and 3000 Å of the substrate 10, more preferably between about 200 Å and 2500 Å. The insulating layer 40 along the sidewalls and the lower insulating layer in the isolation window 35 insulate the surrounding substrate. As can be seen from FIG. 6, one entire side of the lower recess 45 is exposed to the substrate 10, while the other side of the lower recess 45 is partially bounded by the isolation window 35.

Figure 7:
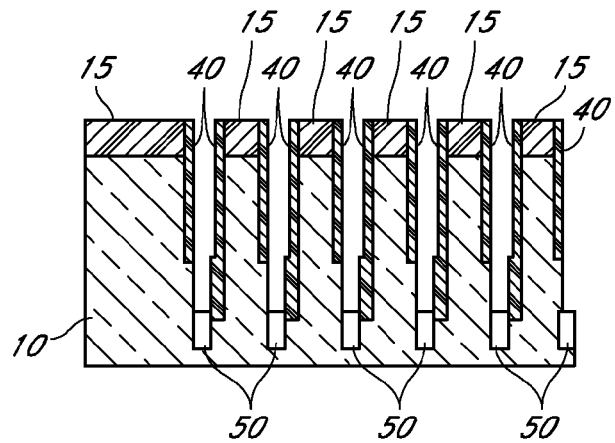
FIG. 7 is a schematic, cross-sectional side view of the substrate of FIG. 6 after depositing an insulating material in the trench.

In FIG. 7, an insulating material 50 is deposited into and recessed back in the lower recess 45 so that only one sidewall of the recess is electrically exposed to the digit line which will be formed within the lower recess 45. In a preferred embodiment, the insulating material 50 has a thickness of between about 100 Å and 2000 Å, more preferably between about 500 Å and 800 Å. In order to fully isolate the selected side of the lower recess, the thickness of the insulating material 50 is greater than the distance between the bottom of the lower recess and the bottom of the isolation window 33. In other words, the insulating material 50 overlaps with the insulating lay 40 to completely isolate the right side of each trench.

Figure 8:
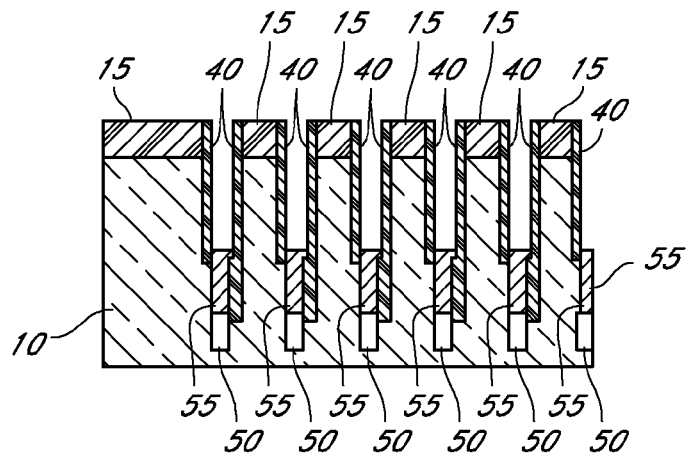
FIG. 8 is a schematic, cross-sectional side view of the substrate of FIG. 7 after depositing and recessing a digit line material in the trench.

As illustrated in FIG. 8, once one side of the lower recess 45 is completely electrically isolated, a conductive digit line 55 is formed within the lower recess 45. Preferred materials for the digit line 55 include metals and metal alloys. Exemplary materials include titanium nitride, titanium, and tungsten. Preferably, the digit line 55 has a vertical thickness of between about 100 Å and 2000 Å, more preferably between about 300 Å and 600 Å.

In one embodiment, a multi-level digit line 55 is formed with layers of several materials. In a preferred embodiment, a lower layer of titanium is first deposited, serving as an adhesion layer, followed by a middle layer of titanium nitride, serving as a conductive barrier, and an upper layer of tungsten fills the remainder of the trench. The thickness of the middle barrier layer is preferably between about 20 Å and 500 Å, more preferably between about 40 Å and 80 Å. The thickness of the lower adhesion layer is preferably between about 10 Å and 600 Å, more preferably between about 100 Å and 300 Å. The thickness of the upper layer is preferably between about 100 Å and 1500 Å, more preferably between about 300 Å and 600 Å. Each such deposition can line the lower recess 45, thus extending over the trench sidewalls.

Figure 9:
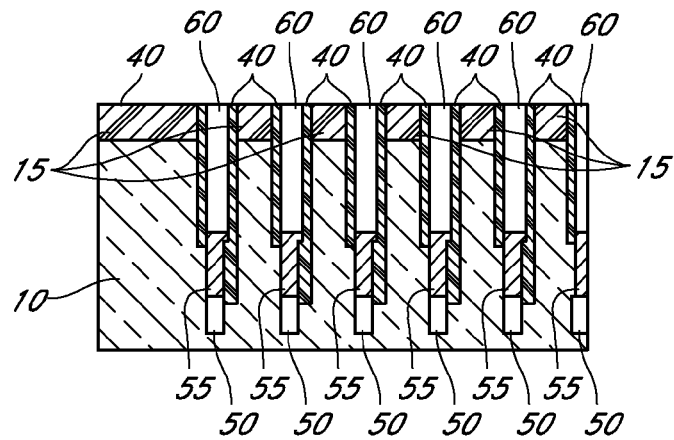
FIG. 9 is a schematic, cross-sectional side view of the substrate of FIG. 8 after depositing an insulating material in the trench and etching back the insulating material.

As seen in FIG. 9, after depositing and recessing the digit line 55, the trench is filled with an insulating material 60. In a preferred embodiment the insulating material is an oxide, such as a tetraethyl orthosilicide (TEOS) oxide or a spin-on oxide. The insulating material is then preferably etched back or planarized, through a process such as chemical mechanical polishing (CMP). In a preferred embodiment, the insulating material fills the trench, and is typically overflows by between about 50 Å and 2000 Å, more preferably between about 300 Å and 600 Å, before CMP or other etch back.

In a preferred embodiment, the buried digit lines 55 are then used to form a DRAM array. An exemplary array is seen after several stages of processing in FIG. 10. Several DRAM process can be used to form the memory array. One example process is found in U.S. patent application Ser. No. 10/934,621 of Tang, et. al, the disclosure of which is hereby incorporated herein by reference.

Figure 10:
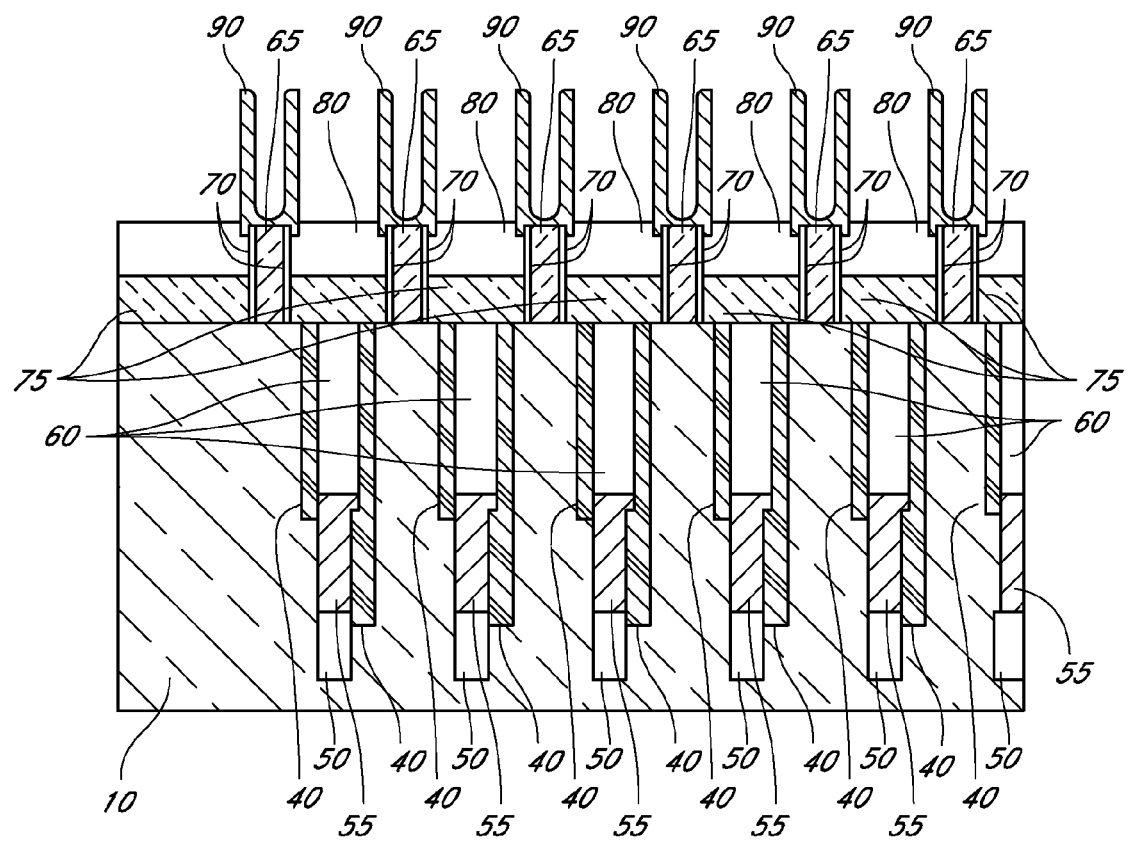
FIG. 10 is a schematic, cross-sectional side view of the substrate of FIG. 9 after forming transistor pillars and cell capacitors.

In the illustrated embodiment of FIG. 10, a transistor pillar 65 is formed on the substrate between the trenches. In a preferred embodiment, the pillars are epitaxial silicon, though in other arrangements the pillars can be etched from a substrate. A gate oxide 70 is then formed on the sides of the transistor pillars 65. In a preferred embodiment, a source region is formed along ridges between the trenches, preferably contacting the transistor pillar. In preferred embodiments, the drain is formed at the top of the transistor pillar 65 and the body of the pillar defines the transistor channel. A word line 75 is formed between neighboring cells. In a preferred embodiment, the word line 75 is a conductive polysilicon and may include strapping self-aligned silicide. While not apparent from the illustrated cross-section, a plurality of word lines are formed in a crossing pattern with the bit lines. In a preferred arrangement, each word line surrounds a row of transistors and serves as a gate electrode for each of the transistors in the row. An insulating layer 80 is deposited over the word lines 75. The top of the transistor pillar 65 is then exposed to form electrical contact to an overlying stacked capacitor. In a preferred embodiment, the capacitor electrode is a container capacitor. A bottom electrode 90 is formed electrically connected to the transistor pillar 65. It will be understood that as intermediate contact plug can be employed between the pillar 65 and the bottom electrode 90. In a preferred embodiment, the bottom electrode 90 comprises a conductive metal or metal alloy. A capacitor dielectric (not pictured) is then formed over the bottom electrode. A top electrode is then formed the dielectric. In a preferred embodiment the top electrode is a common reference electrode for the whole array.

An exemplary process flow for the illustrated vertical surround gate (VSG) transistor is disclosed in U.S. application Ser. No. 10/934,621, filed Sep. 2, 2004, the disclosure of which is incorporated by reference herein. The skilled artisan will readily appreciate, however, that the buried bit line processes and structures disclosed herein are useful for a number of different transistor and memory array designs.

Thus, in a preferred embodiment illustrated in FIG. 10, the digit line 55 is electrically connected to the substrate 10, and particularly to the transistor sources, on one side of the trench, and isolated by the isolation liner 40 on the other side (right side in FIG. 10). Preferably, the bottom of the insulating liner 40 in the isolation window 35 extends below or even with the bottom of the digit line 55. In the illustrated embodiment, an insulator 50 is formed beneath the digit line 55 within the lower recess 45. The digit line 55 is preferably isolated from above by an insulating material 60.

In a preferred embodiment, vertical transistors are formed between the trenches. The vertical transistors include transistor pillars 65 over the substrate 10. Preferably, a plurality of transistor pillars 65 are formed on a ridge running parallel between the trenches in the dimension into and out of the paper. A gate oxide 71 surrounds the sidewalls of the transistor pillar 65. Preferably, a word line 75 serves as the gate electrode for each of a plurality of transistors in a row. An insulating layer 80 is formed over the word line 75. A bottom container capacitor electrode 90 is formed over each transistor pillar. A capacitor dielectric and top electrode is preferably formed over each of the electrodes. These structures are arranged in a memory array. The number of cells, trenches, and digit lines may vary based upon the desired capacity of the memory array.

Figure 11:
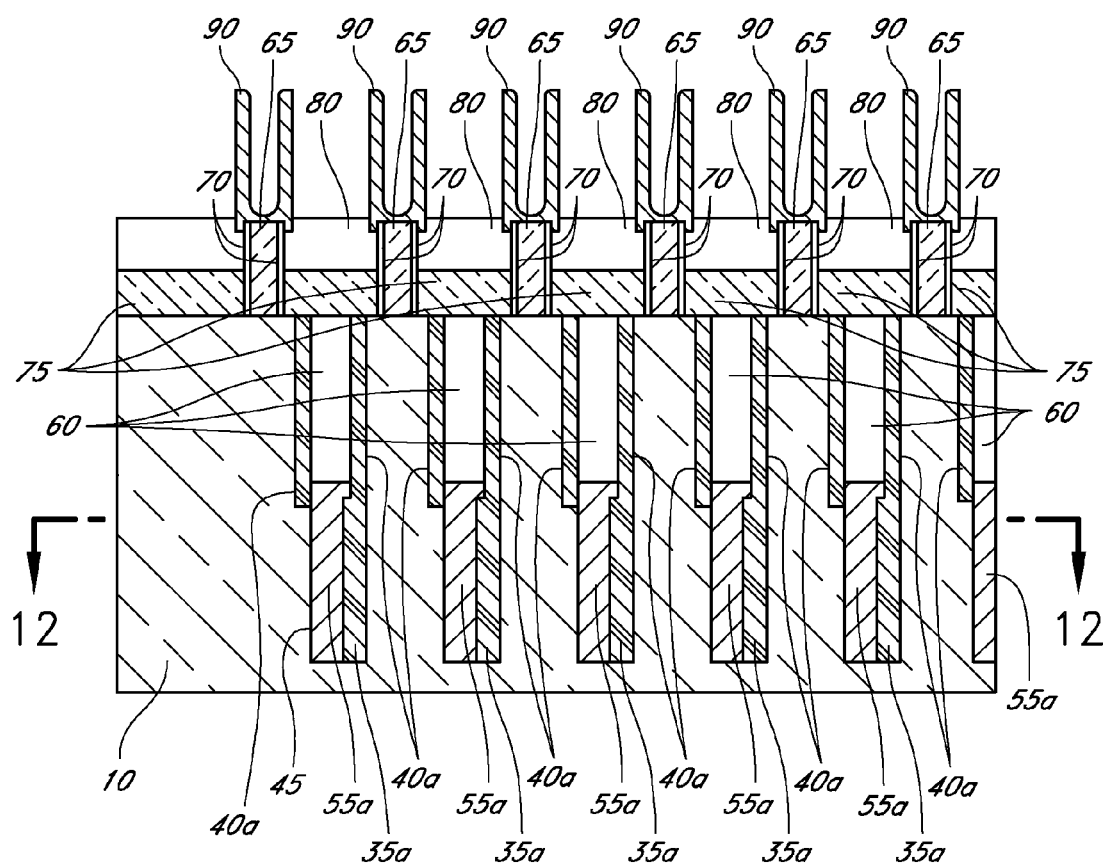
FIG. 11 is a schematic, cross-sectional side view of an array of memory cells formed in accordance with another embodiment of the invention.

With reference to FIG. 11, in another embodiment, the isolation window 35a formed using the spacers as is extended deeper into the substrate 10 than in the embodiment of FIG. 4. Preferably, the isolation window is extended below the bottom of the subsequently formed lower recess 45a. As described above, the isolation window 35a is filled with the insulating layer 40a. The subsequent lower recess 45a extends to approximately the same depth or less deep than the isolation window 35a. Preferably the bottom of the isolation window 35a is 100 Å to 2000 Å below the bottom of the digit line 55a, more preferably the bottom of the isolation window 35a is 500 Å to 800 Å below the bottom of the digit line 55a. The lower insulating material 50 of FIG. 7 can thus be omitted, saving the deposition and recess steps therefore. Accordingly, the digit line 55a is deposited directly into the lower recess 45a.

In the resulting structure, the bottom of the insulating material 40a in the isolation window 35a preferably extends below the digit line 55a or is co-extensive with the bottom of the digit line 55a. On the other side of the trench, the top edge of the digit line 55a is isolated from the transistor channel by the isolation liner 40a.

Figure 12:
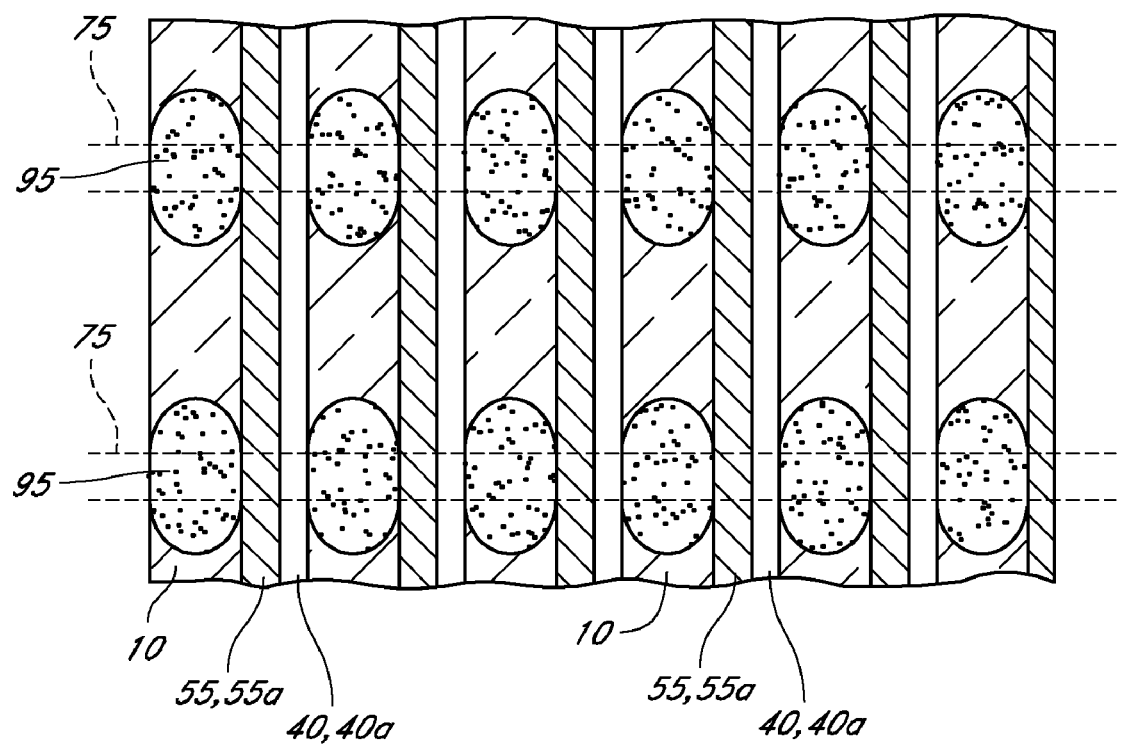
FIG. 12 is a schematic, cross-sectional plan view of the array of memory cells taken along lines 12-12 of FIG. 10 or 11.

As best seen from the cross-sectional plan of FIG. 12, the resultant buried digit line 55 or 55a directly contacts the ridge of the substrate 10 along which a column of source regions 95 are formed. The bit digit line 55 or 55a is in continuous contact with the ridge of substrate material 10, such that no independent bit line contact structure is required. Rather, the digit line 55 or 55a intermittently contacts source regions along its length. It will be understood that the source regions extend upwards to the surface of the substrate 10, where epitaxial pillars extend upwards and form the channel regions of the transistors. Orthogonal to the digit lines 55 or 55a are a plurality of word lines 75, shown in dotted lines in FIG. 12, overlapping a row of transistors and surrounding the pillar channel regions to define vertical surround gate (VSG) transistors. On one side of the digit line structures 55 or 55a, the insulating layer 40 or 40a electrically separates the digit line 55 or 55a from the next adjacent ridge of substrate material 10.

Advantageously, because the digit line 55 or 55a directly contacts the substrate ridge 10 in the source regions, no separate contact structure is required. Not only does this save the additional process steps for forming a contact structure, but also save the additional space that would be otherwise required for making separate bit line contacts.

It will be appreciated by those skilled in the art that various omissions, additions and modifications may be made to the methods and structures described above without departing from the scope of the invention. All such modifications and changes are intended to fall within the scope of the invention, as defined by the appended claims.

I claim:

1. An integrated circuit having a memory array, the integrated circuit comprising:
    a trench comprising a first trench wall and a second trench wall substantially parallel to and spaced from the first trench wall;
    a digit line within the trench in contact with the first trench wall, wherein said contact electrically connects the digit line to sources of a plurality of transistors in the memory array; and
    an insulating layer within the trench separating the digit line from the second trench wall.

2. The integrated circuit of claim 1, further comprising a memory storage device coupled to one of the plurality of transistors.

3. The integrated circuit of claim 1, wherein the memory array comprises a dynamic random access memory (DRAM) device.

4. The integrated circuit of claim 1, wherein each of the plurality of transistors has a gate electrode, wherein a corresponding word line serves as the gate electrode, and wherein a memory cell is addressed via the corresponding word line and the digit line.

5. The integrated circuit of claim 1, wherein the insulating layer comprises silicon nitride.

6. The integrated circuit of claim 1, further comprising a first semiconductor ridge adjacent to the first trench wall and a second semiconductor ridge adjacent to the second trench wall, wherein the first and second ridges are separate by the trench, and wherein the first semiconductor ridge serves as active areas for the plurality of transistors.

7. The integrated circuit of claim 6, wherein the plurality of transistors comprises transistor pillars formed above the level of the first semiconductor ridge.

8. An integrated circuit comprising:
    a trench in a semiconductor material, the trench having a first trench wall and a second trench wall opposite the first trench wall;
    a digit line in the trench, wherein the digit line electrically contacts a transistor active region via the first trench wall; and
    an insulating element in the trench, wherein the insulating element separates the digit line from the second trench wall.

9. The integrated circuit of claim 8, wherein the semiconductor material comprises part of a wafer.

10. The integrated circuit of claim 8, wherein the transistor is an access device for a memory cell.

11. The integrated circuit of claim 10, wherein the memory cell further comprises a memory storage element positioned above the transistor active region.

12. The integrated circuit of claim 11, wherein the memory storage element comprises a capacitor.

13. The integrated circuit of claim 8, wherein the digit line is a bit line.

14. The integrated circuit of claim 8, wherein the trench has a depth of between about 2000 Å and 3000 Å.

15. The integrated circuit of claim 8, further comprising insulating material in the trench below the digit line.

16. The integrated circuit of claim 8, further comprising a first insulating liner in physical contact with the first trench wall, wherein the insulating element comprises a second insulating liner in physical contact with the second trench wall, wherein a portion of the insulating element extends to a depth below any portion of the first insulating liner in the trench.

17. The integrated circuit of claim 8, wherein the insulating element extends to a depth greater than any portion of the digit line in the trench.

18. The integrated circuit of claim 8, wherein the semiconductor material comprises bulk silicon.

19. The integrated circuit of claim 8, further comprising a word line serving as a gate of the transistor.

20. The integrated circuit of claim 8, wherein the digit line electrically contacts a plurality of transistors via the first trench wall.

* * * * *